United States Patent
Elsherbini et al.

(10) Patent No.: US 9,832,863 B2
(45) Date of Patent: Nov. 28, 2017

(54) METHOD OF FABRICATING A STRETCHABLE COMPUTING DEVICE

(71) Applicant: Intel Corporation, Santa Clara, CA (US)

(72) Inventors: Adel Elsherbini, Chandler, AZ (US); Aleksandar Aleksov, Chandler, AZ (US); Shawna Liff, Gilbert, AZ (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 14/866,614

(22) Filed: Sep. 25, 2015

(65) Prior Publication Data
US 2017/0094774 A1    Mar. 30, 2017

(51) Int. Cl.
| | |
|---|---|
| *H05K 1/02* | (2006.01) |
| *H05K 1/11* | (2006.01) |
| *H05K 1/18* | (2006.01) |
| *H05K 3/22* | (2006.01) |

(Continued)

(52) U.S. Cl.
CPC .......... *H05K 1/028* (2013.01); *H05K 1/0283* (2013.01); *H05K 1/115* (2013.01); *H05K 1/181* (2013.01); *H05K 3/22* (2013.01); *H05K 3/301* (2013.01); *H05K 1/0393* (2013.01); *H05K 1/118* (2013.01);
(Continued)

(58) Field of Classification Search
CPC .. H01L 24/50; H05K 1/189; H05K 2201/042; H05K 2201/046; H05K 2201/05; H05K 1/0277; H05K 1/0278; H05K 1/028; H05K 1/0281; H05K 1/0283; H05K 1/0393; H05K 1/118; H05K 1/147; H05K 1/148; H05K 1/115; H05K 3/301; H05K 3/22; H05K 1/181
See application file for complete search history.

(56) References Cited

U.S. PATENT DOCUMENTS

| | | | |
|---|---|---|---|
| 8,207,473 B2* | 6/2012 | Axisa | B32B 37/185 174/254 |
| 8,861,220 B2* | 10/2014 | Loher | H05K 1/0283 174/254 |
| 9,378,450 B1* | 6/2016 | Mei | G06K 19/0776 |

(Continued)

FOREIGN PATENT DOCUMENTS

WO    WO-2015099737 A1    7/2015

OTHER PUBLICATIONS

"International Application Serial No. PCT/US2016/048476, International Search Report dated Dec. 15, 2016", 3 pgs.
(Continued)

*Primary Examiner* — Ishwarbhai B Patel
(74) *Attorney, Agent, or Firm* — Schwegman Lundberg & Woessner, P.A.

(57) ABSTRACT

Some forms relate to a stretchable computing device that includes a stretchable body; a first electronic component embedded within the stretchable body; a second electronic component embedded within the stretchable body; and wherein the first electronic component and the second electronic component are connected by stretchable electrical connectors that include vias. The stretchable electrical connectors are non-planar and/or may have a partial zig-zag shape and/or a partial coil shape. In some forms, the stretchable computing device further includes a textile attached to the stretchable body.

6 Claims, 9 Drawing Sheets

(51) Int. Cl.
*H05K 3/30* (2006.01)
*H05K 1/03* (2006.01)
(52) U.S. Cl.
CPC ... *H05K 2201/05* (2013.01); *H05K 2201/057* (2013.01); *H05K 2201/095* (2013.01)

(56) References Cited

U.S. PATENT DOCUMENTS

| | | |
|---|---|---|
| 2004/0192082 A1 | 9/2004 | Wagner et al. |
| 2012/0051005 A1 | 3/2012 | Vanfleteren et al. |
| 2014/0104793 A1* | 4/2014 | Park .................. H05K 1/0283 361/749 |
| 2015/0069617 A1 | 3/2015 | Arora et al. |
| 2015/0189753 A1 | 7/2015 | Goyal et al. |

OTHER PUBLICATIONS

"International Application Serial No. PCT/US2016/048476, Written Opinion dated Dec. 15, 2016", 8 pgs.

* cited by examiner

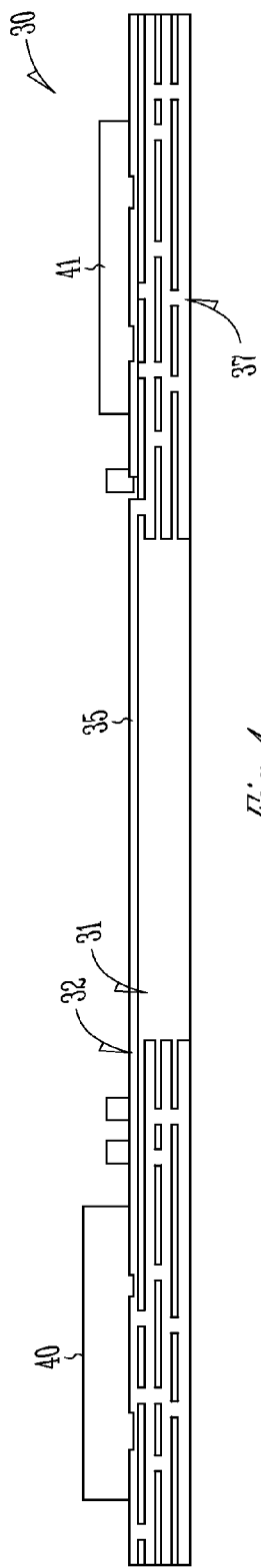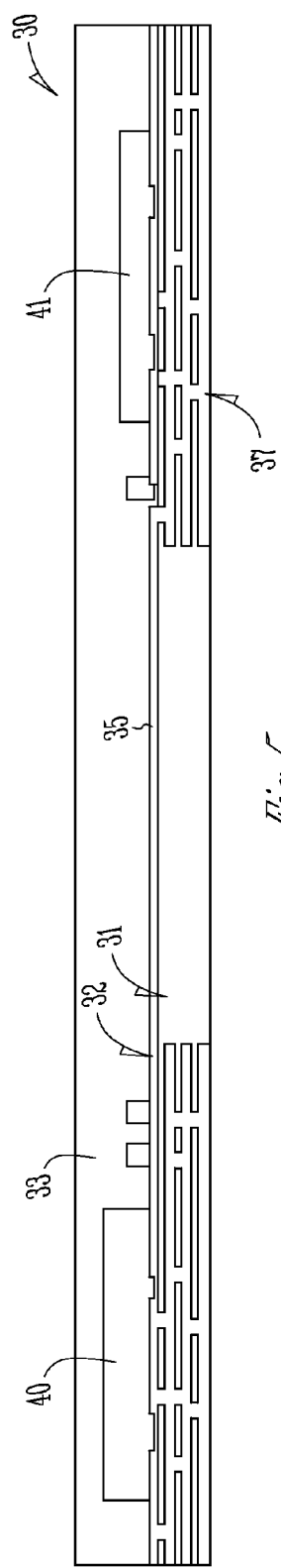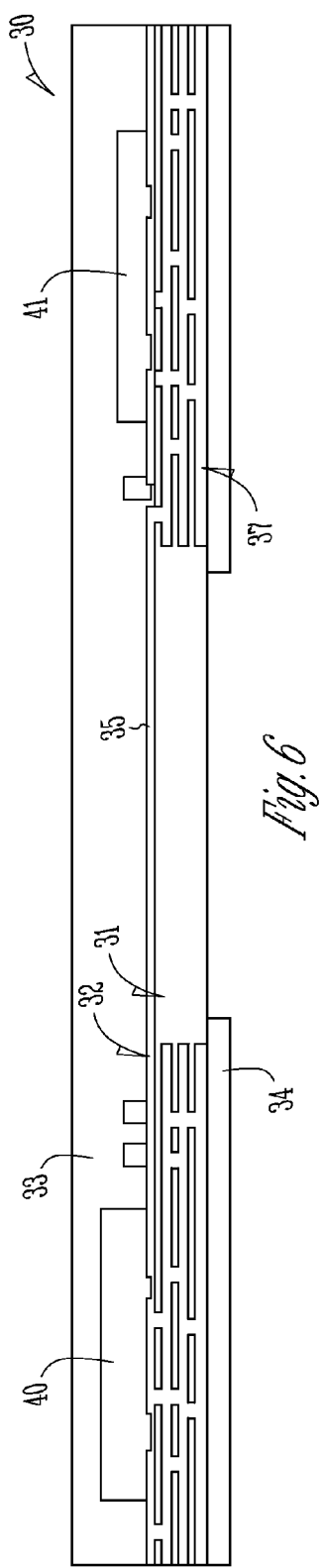

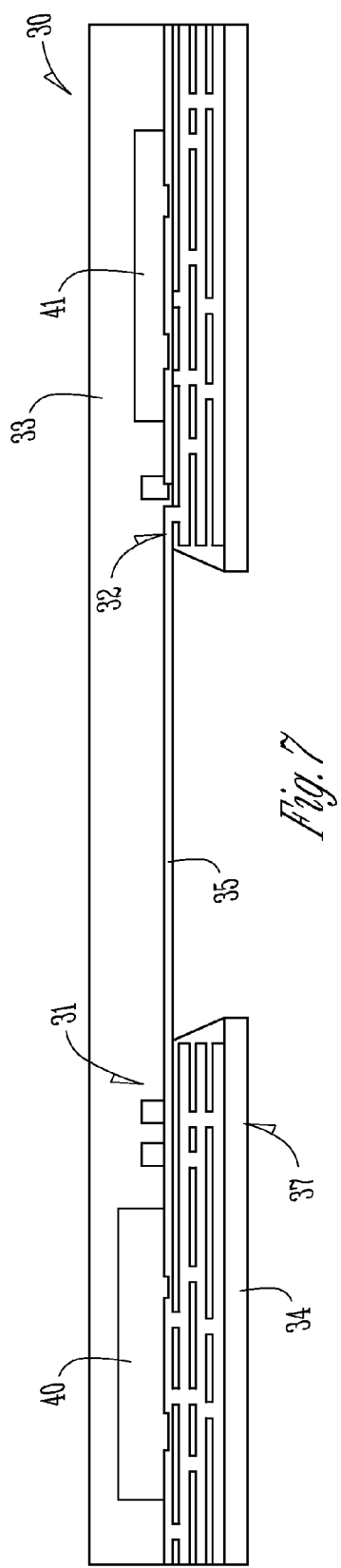
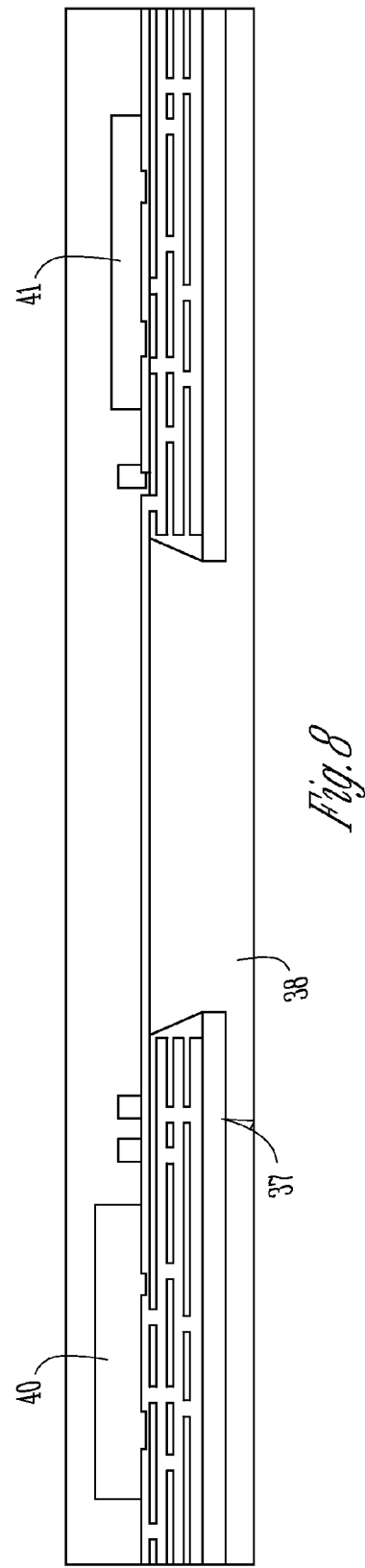

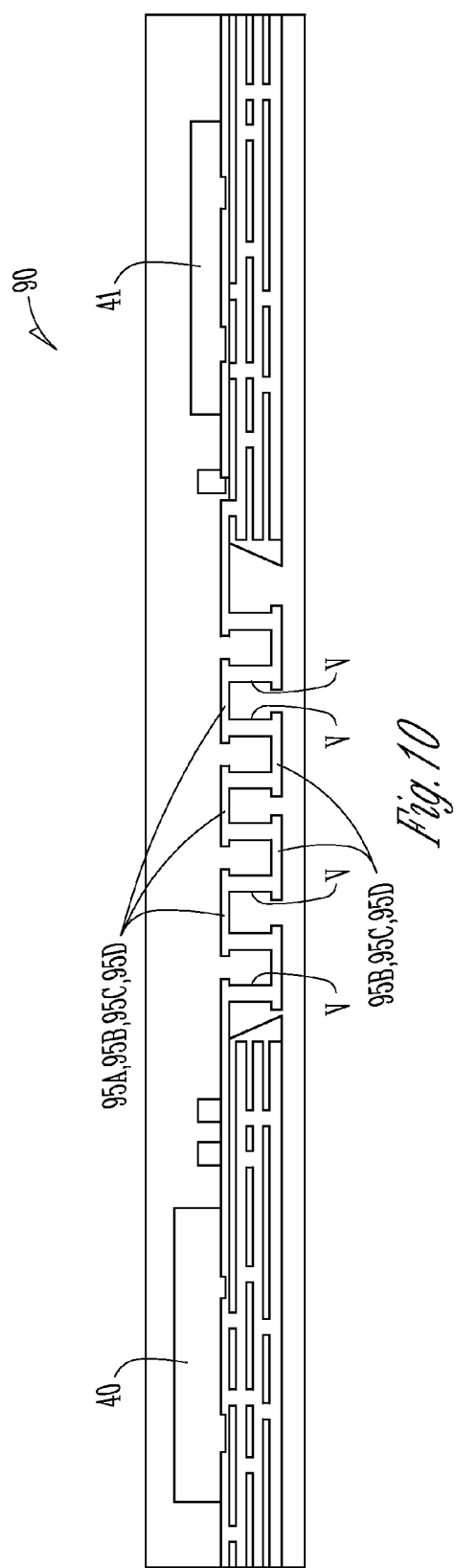

METHOD OF FABRICATING A STRETCHABLE COMPUTING DEVICE

TECHNICAL FIELD

Embodiments described herein generally relate to a computing device, and more particularly to a method of fabricating a stretchable computing device.

BACKGROUND

Stretchable computing devices enable various approaches to managing different types of applications where computing power may be utilized to enhance the application. As examples, healthcare and fitness are just a couple of applications that may utilize stretchable computing devices. Sometimes the size and/or the shape of an electronic device makes it challenging to provide input (e.g., from a sensor) into a stretchable computing device.

One class of stretchable computing devices that is rising in importance relates to textiles which include integrated electronic devices. There may be a variety of operational and manufacturing concerns associated with incorporating integrated electronic devices that are part of electronic packages or electronic systems into textiles that are meant to be worn on the body.

One known limitation with conventional printed circuit board (PCB) technology relates to using rigid PCB technology for stretchable applications. Using PCB technology for stretchable applications (e.g., wearable devices) may be problematic because in many applications stretchability of up to 30% may be desired. Some conventional methods use a flexible PCB (e.g., a polyimide substrate) that is then laser cut to form dielectric meanders around the substrate.

However, utilizing conventional PCB processes usually produces a relatively expensive structure and is very difficult to use on multi-layer boards. In addition, assembling various electronic components to flexible boards may be very challenging. Flexible boards are also generally more expensive than standard rigid boards and they have many limitations on design rules as compared to rigid boards and electronic packages.

BRIEF DESCRIPTION OF THE DRAWINGS

FIG. 4 is a schematic side view of the example stretchable electronic package shown in FIG. 3.

FIG. 5 is a schematic side view of the example stretchable electronic package shown in FIG. 4 after an upper surface of the example stretchable electronic package is covered with an elastomer.

FIG. 6 is a schematic side view of the example stretchable electronic package shown in FIG. 5 after a patterned resist is placed on the example stretchable electronic package.

FIG. 7 is a schematic side view of the example stretchable electronic package shown in FIG. 6 after the stretchable electronic package has been etched to expose stretchable electrical connectors.

FIG. 8 is a schematic side view of the example stretchable electronic package shown in FIG. 7 after the resist has been removed and the lower surface of stretchable electronic package is covered with an additional elastomer.

FIG. 10 is a schematic side view of the example stretchable electronic device shown in FIG. 9.

DESCRIPTION OF EMBODIMENTS

Figure 1:
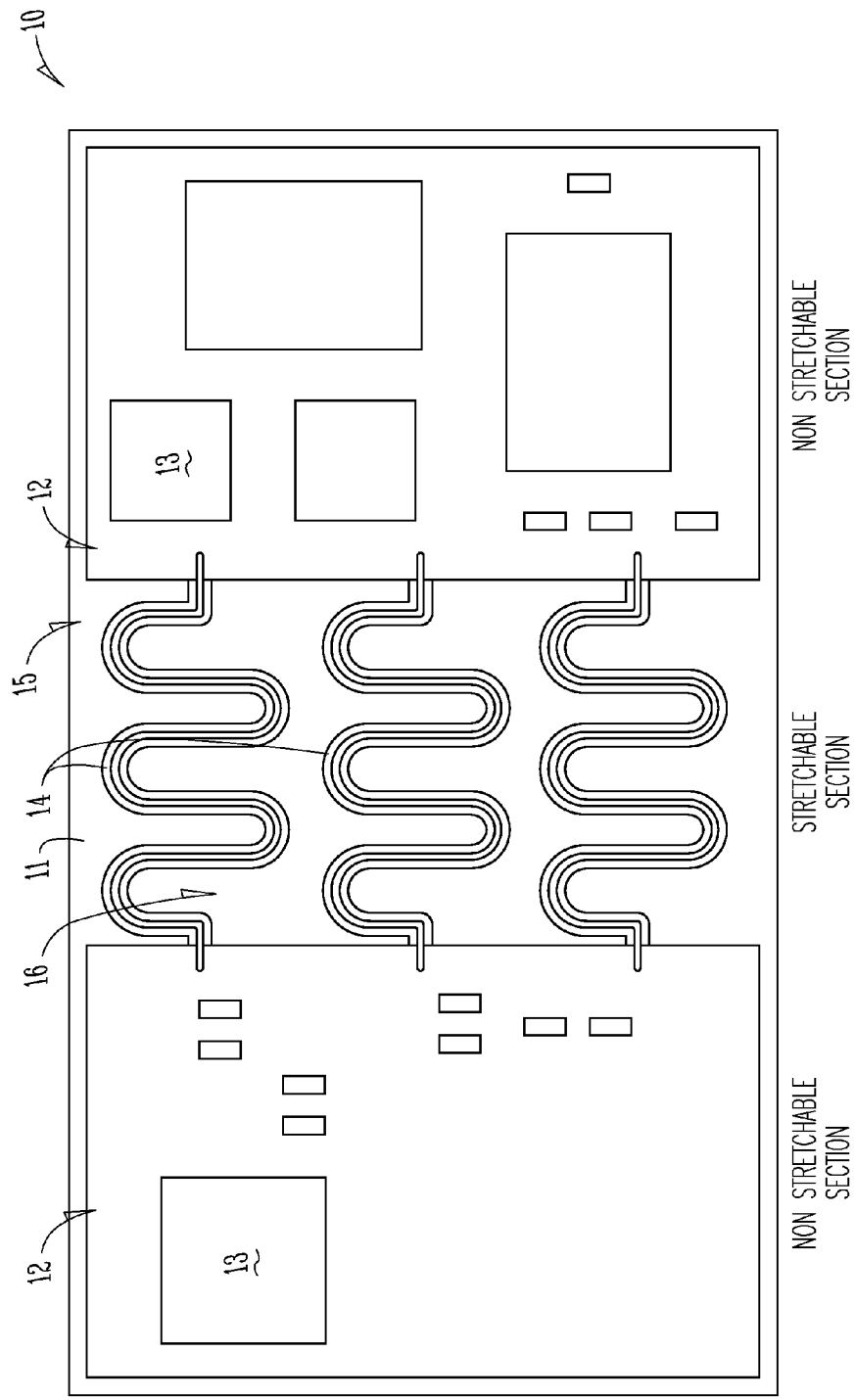
FIG. 1 is a schematic top view of an example stretchable electronic system that may be used in a stretchable computing device.

The following description and the drawings sufficiently illustrate specific embodiments to enable those skilled in the art to practice them. Other embodiments may incorporate structural, logical, electrical, process, and other changes. Portions and features of some embodiments may be included in, or substituted for, those of other embodiments. Embodiments set forth in the claims encompass all available equivalents of those claims.

Orientation terminology, such as "horizontal," as used in this application is defined with respect to a plane parallel to the conventional plane or surface of a wafer or substrate, regardless of the orientation of the wafer or substrate. The term "vertical" refers to a direction perpendicular to the horizontal as defined above. Prepositions, such as "on," "side" (as in "sidewall"), "higher," "lower," "over," and "under" are defined with respect to the conventional plane or surface being on the top surface of the wafer or substrate, regardless of the orientation of the wafer or substrate.

The stretchable computing devices described herein may be placed in a variety of locations on a human body. In some forms, the example stretchable computing devices may be integrated with (or attached to) textiles (e.g., clothing). In other forms, the example wearable computing devices may be attached directly to the skin of someone (i.e., similar to a bandage) that utilizes any of the example stretchable computing devices.

The example methods and stretchable computing devices described herein may include a variety of electronics. Some examples include a power supply and/or a communication device among other types of electronics.

As used herein "stretchable" refers to the ability elongate in the direction of an applied force. The amount of stretching will be determined in part based on the application where any of the example methods and stretchable computing devices described herein are to be used. As an example, the degree of stretching may be different when the example stretchable computing devices described herein are integrated with (or connected to) textiles (e.g., clothing) as opposed when the example stretchable computing devices described herein are attached directly to the skin of someone that utilizes any of the example and stretchable computing devices.

The methods and stretchable computing devices described herein may utilize a variety of printed circuit board packaging technologies where the substrate is etched in areas where it is desirable for the stretchable computing devices to be stretchable. As an example, the etching may be done chemically using sacrificial substrate material, or physically using reactive ion etching or laser ablation (among other processes).

The methods and stretchable computing devices described herein may provide for substrate removal at a lower relative processing cost and may potentially be applied at a panel level. In addition, the methods and stretchable computing devices may provide flexibility in order to choose the best substrate technology for a given application. As an example, the methods and electronic systems described herein may utilize small electronic components and fine-pitch dies as well as high density interconnect board configurations to optimize costs for larger electronic components.

In addition, the methods and stretchable computing devices described herein may be high volume manufacturing compatible and may not have any limitation as to the number of layers that may be utilized, thereby allowing relatively complex electronic systems to be fabricated. The methods and stretchable computing devices may also reduce the limitations that are associated with including rigid and/or flexible sections within the stretchable computing devices.

FIG. 1 is a schematic top view of an example stretchable electronic system 15 that may be used in a stretchable computing device 10. The stretchable computing device 10 includes a stretchable member 11 that includes rigid sections 12 and a stretchable section 16. In some forms, the rigid sections include electronic components 13 that are connected by stretchable electrical connectors 14 in the stretchable section 16.

Figure 2:
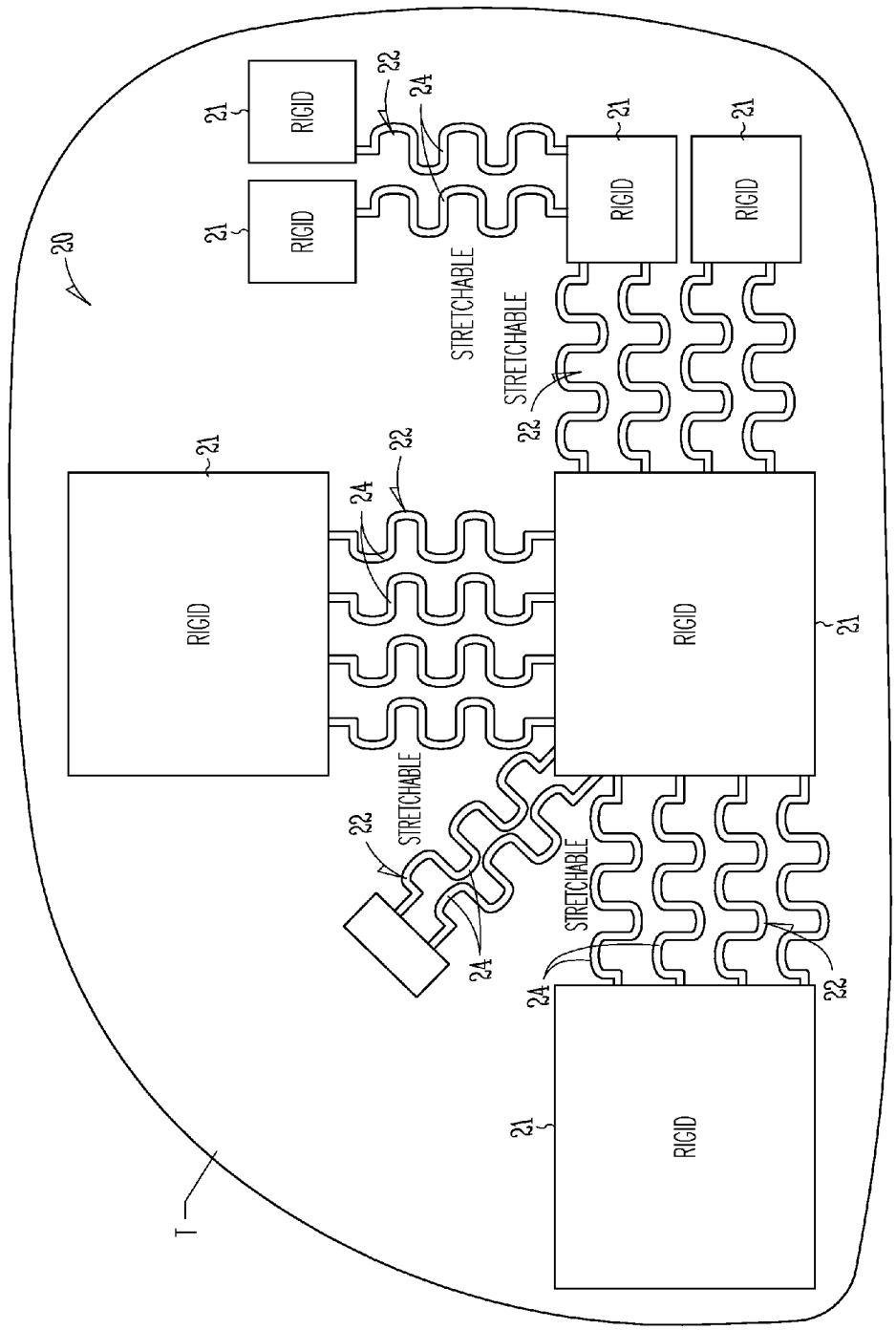
FIG. 2 is a schematic top view of another example stretchable electronic system that may be used in a stretchable computing device.

FIG. 2 is a schematic top view of an example stretchable computing device 20. The illustrated example stretchable computing device 20 includes a variety of rigid sections 21 that are connected by a variety of stretchable sections 22. The rigid sections 21 may include one or more electronic components (not shown) that are electrically connected by stretchable electrical connectors 24. The stretchable electrical connectors 24 may be any type of stretchable electrical connector that is known now, or discovered in the future.

In some forms, any of the example stretchable computing devices described herein may be connected to a textile T. The manner in which the textile T is connected to the stretchable computing devices will depend in part on the type of stretchable computing device that used as well as the type of textile T (among other factors).

Figure 3:
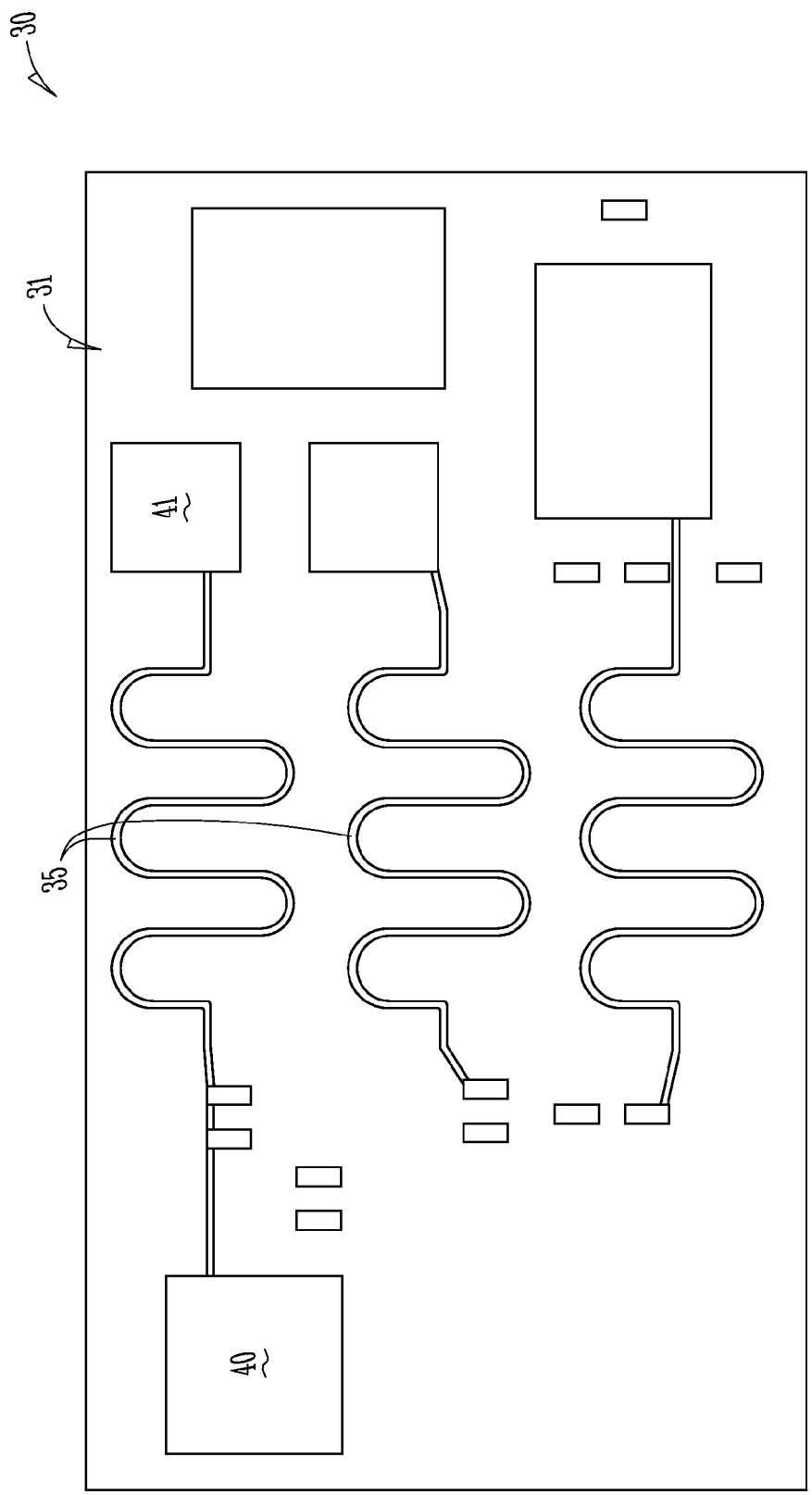
FIG. 3 is a schematic top view of yet another example stretchable electronic system that may be used in a stretchable computing device.

FIG. 3 is a schematic top view of an example stretchable electronic package 31 that may be used in a stretchable computing device 30. FIG. 4 is a schematic side view of the example stretchable electronic package 31 shown in FIG. 3. FIG. 5 is a schematic side view of the example stretchable electronic package 31 shown in FIG. 4 after an upper surface 32 of the example stretchable electronic package 31 is molded with a molding material 33 (e.g., an elastomer).

FIG. 6 is a schematic side view of the example stretchable electronic package 31 shown in FIG. 5 after a patterned resist 34 is placed on a lower surface 37 of the example stretchable electronic package 31. FIG. 7 is a schematic side view of the example stretchable electronic package 31 shown in FIG. 6 after the stretchable electronic package 31 has been etched to expose stretchable electrical connectors 35.

FIG. 8 is a schematic side view of the example stretchable electronic package 31 shown in FIG. 7. FIG. 8 shows the example stretchable electronic package 31 after the resist 34 has been removed and a lower surface 37 of the stretchable electronic package 31 has been molded with a molding material 38 (e.g., an elastomer) to form the stretchable electronic device 30.

It should be noted that the materials that are used for the elastomer molds 33, 38 include but are not limited to, PDMS (Poly DiMethyl Siloxane or other silicone based elastomers) or thermoplastic polyurethane (TPU) (among many other potential materials). The stretchable elastomer molds 33, 37 that are described herein may be made of the same material (or different materials) depending on the application where the stretchable electronic systems 31 that are described herein are to be utilized.

A method of fabricating a stretchable computing device 30 will now be described with reference to FIGS. 4-8. The method includes covering an upper surface 32 of a stretchable electronic system 31 with an elastomer 33. The stretchable electronic system 31 includes a first electronic component 40 and a second electronic component 41 that are connected by stretchable electrical connectors 35 (see FIGS. 4 and 5).

The method further includes removing a portion of the stretchable electronic system 31 to expose the stretchable electrical connectors 35 (see FIG. 7). The method further includes covering a lower side 37 of the stretchable electronic package 31 with an additional elastomer 38 (see FIG. 8).

The method may further include attaching a patterned resist 34 to the lower surface 37 of the stretchable electronic system 31 before removing a portion of the stretchable electronic system 31 (see FIG. 6). In some forms, the patterned resist 34 does not cover the stretchable electrical connectors 35. The method may further include removing the patterned resist 34 from the lower surface 37 of the stretchable electronic system 31 before covering the lower surface 37 of the stretchable electronic system 31 with the additional elastomer 38.

In some forms, the stretchable electrical connectors 35 are meandering traces that have a modified sinusoidal shape. It should be noted that the stretchable electrical connectors may have any configuration that is known now, or discovered in the future. The degree to which the stretchable electrical connectors 35 need to be stretchable will depend in part on the electronic components that are included in the stretchable computing device 30 as well as the application where the stretchable computing device 30 is to be utilized (among other factors).

In some forms, the first electronic component 40 is a first electronic package and a second electronic component 41 is a second electronic package. The types and sizes of electronic components that are included in the stretchable computing device 30 will depend in part on the application where the stretchable computing device 30 is to be utilized (among many other factors).

In some forms, covering the upper surface 32 of the stretchable electronic system 31 with an elastomer 33 may include covering the upper surface 32 of the stretchable electronic system 31 with silicone. The type and amount of elastomer 33 that is used to cover the upper surface 32 of the stretchable electronic system 31 will depend in part on the overall size of the stretchable computing device 30 as well as the types of materials that are included in the stretchable electronic computing device 30 (among many other factors).

In some forms, removing a portion of the stretchable electronic system 31 to expose the stretchable electrical connectors 35 includes etching the stretchable electronic system 31 to expose the stretchable electrical connectors 35. As an example, the stretchable electronic system 31 may be etched to the top most layer of the conductive pattern 35. The etching may be done using reactive ion etching, laser ablation or wet/chemical etching.

The etching process that is utilized will depend in part on the total thickness of the substrate in the stretchable electronic system as well as the desired shape for the sidewalls and the compatibility with the elastomer that is used in the substrate material. The manner in which the portion of the stretchable electronic system 31 is removed from under the stretchable electrical connectors 35 will depend in part on the type of material that is used to cover the stretchable electrical connectors 35 (among other factors).

Figure 9:
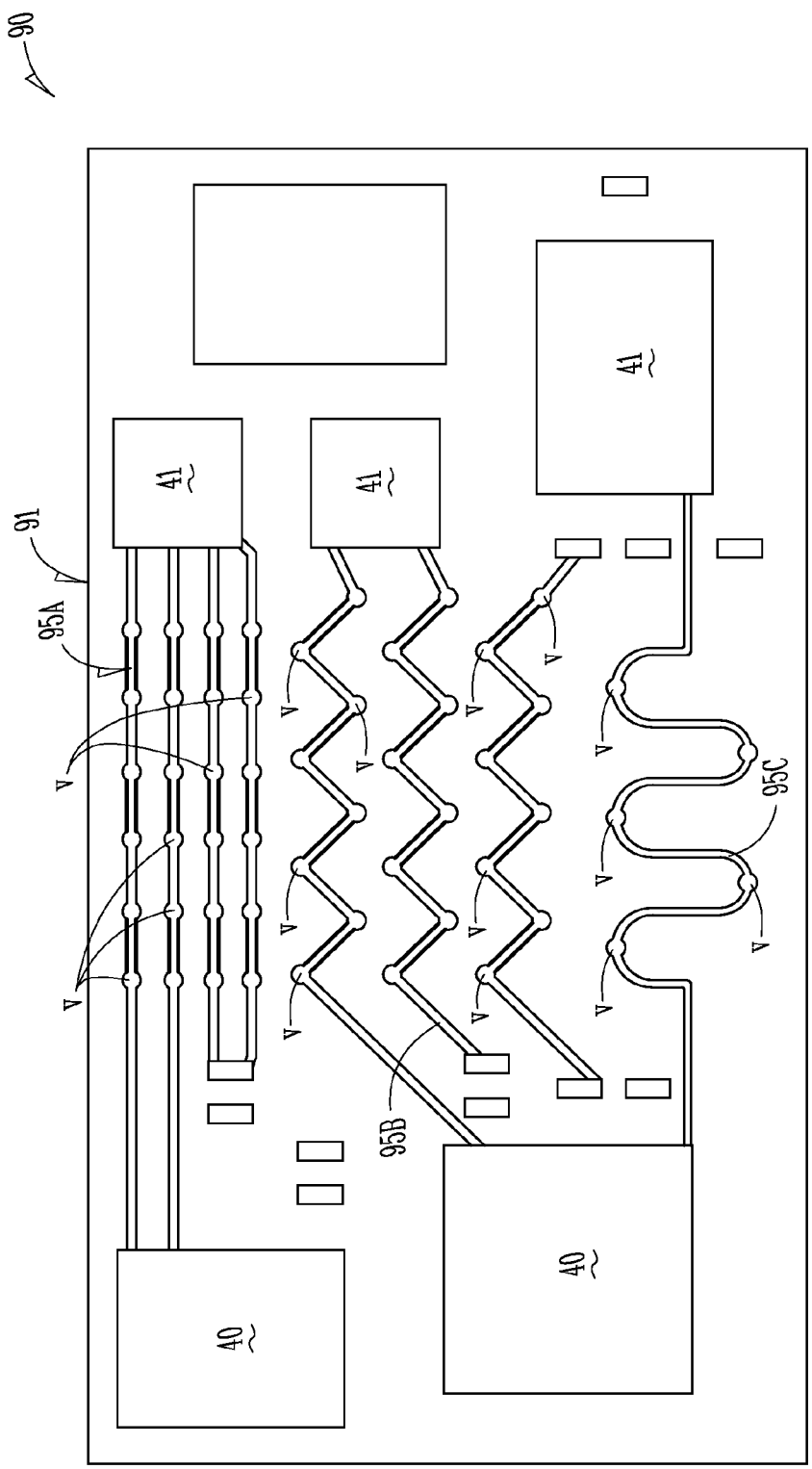
FIG. 9 is a schematic top view of another example stretchable electronic device.

FIG. 9 is a schematic top view of another example stretchable computing device 90. FIG. 10 is a schematic side view of the example stretchable electronic device 90 shown in FIG. 9.

The stretchable computing device 90 includes an electronic system 91 that is similar to the electronic system 31 shown in FIG. 3. The electronic system 91 differs from the electronic system 31 in that the electronic components 40, 41 that are included in the stretchable electronic system 91 are connected by stretchable electrical connectors 95 that include via sections V (see FIGS. 9 and 10).

FIG. 9 shows three different types of stretchable electrical connectors 95A, 95B, 95C that may be used in the stretchable electronic system 91. The type of stretchable electrical connectors 95A, 95B, 95C that are utilized in the stretchable computing device 90 will depend in part on the overall layout of the stretchable electronic system 91 as well as manufacturing considerations that are associated with producing the stretchable computing device 90 (among other factors).

Figure 13:
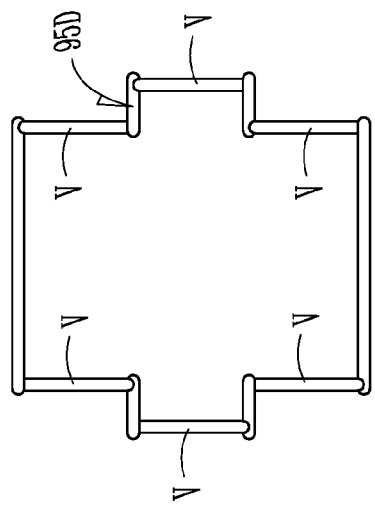
FIG. 13 is a schematic side view of example stretchable electrical connectors shown in FIGS. 11-12.
Figure 12:
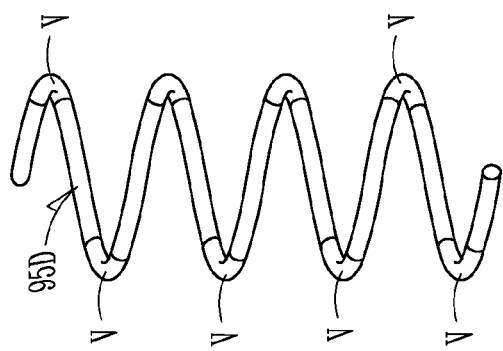
FIG. 12 is a schematic top view of example stretchable electrical connectors shown in FIG. 11.
Figure 11:
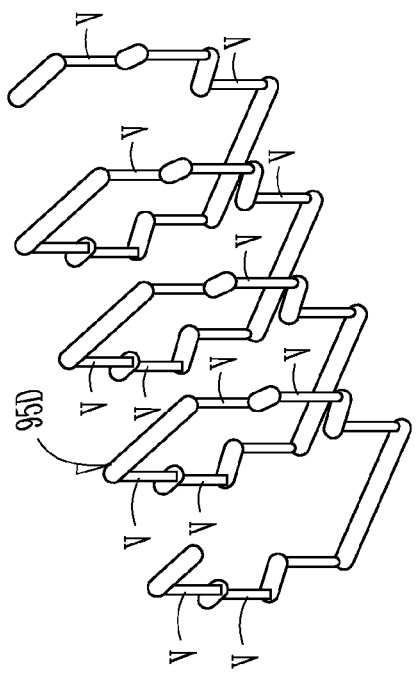
FIG. 11 is a schematic perspective view of example stretchable electrical connectors that may be used in the stretchable electronic device shown in FIGS. 9 and 10.

It should be noted that a variety of other forms are contemplated for the stretchable electrical connectors that include via sections V. FIGS. 11-13 are schematic perspective, top and side views of another example electrical connector 95D that may be utilized in the stretchable electronic system 91. It should be noted that any combination of the illustrated stretchable electrical connectors 95A, 95B, 95C, 95D may be used in the stretchable electronic system 91 (including two-dimensional stretchable electrical connectors as well as other types of stretchable electrical connectors that are not shown).

As shown in FIGS. 9 and 11-13, the stretchable electrical connectors 95B, 95C, 95D may be non-planar. In addition, the stretchable electrical connectors 95B may have a zig-zag shape. As shown in FIGS. 11-13, the non-planer stretchable electrical connectors 95D include electrical vias V and have a partial zig-zag shape and a partial coil shape (coil shape shown most clearly in FIG. 12). The use of vias V in the disclosed stretchable computing devices 90 described herein may permit a much higher routing density than is capable with conventional computing devices.

Figure 14:
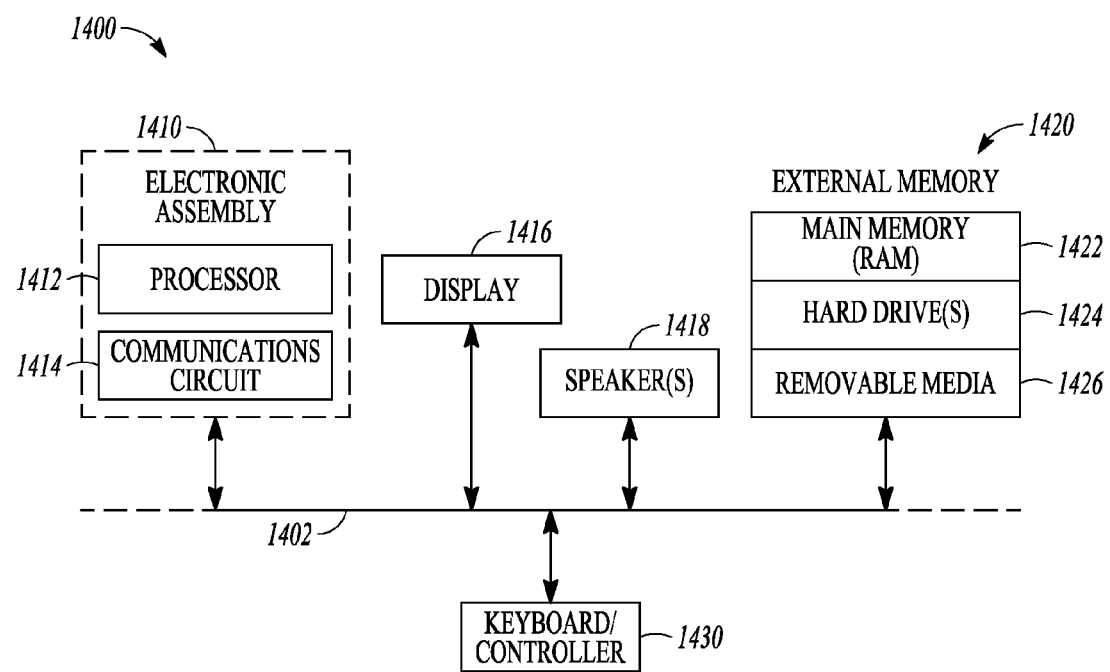
FIG. 14 is block diagram of an electronic apparatus that includes the stretchable computing devices and/or the electronic systems described herein.

FIG. 14 is a block diagram of an electronic apparatus 1400 incorporating at least one method and/or stretchable computing devices described herein. Electronic apparatus 1400 is merely one example of an electronic apparatus in which forms of the at least one method and/or stretchable computing devices described herein may be used. Examples of an electronic apparatus 1400 include, but are not limited to, personal computers, tablet computers, mobile telephones, game devices, MP3 or other digital media players, etc. In this example, electronic apparatus 1400 comprises a data processing system that includes a system bus 1402 to couple the various components of the electronic apparatus 1400. System bus 1402 provides communications links among the various components of the electronic apparatus 1400 and may be implemented as a single bus, as a combination of busses, or in any other suitable manner.

An electronic apparatus 1400 as describe herein may be coupled to system bus 1402. The electronic apparatus 1400 may include any circuit or combination of circuits. In one embodiment, the electronic apparatus 1400 includes a processor 1412 which can be of any type. As used herein, "processor" means any type of computational circuit, such as but not limited to a microprocessor, a microcontroller, a complex instruction set computing (CISC) microprocessor, a reduced instruction set computing (RISC) microprocessor, a very long instruction word (VLIW) microprocessor, a graphics processor, a digital signal processor (DSP), multiple core processor, or any other type of processor or processing circuit.

Other types of circuits that may be included in electronic apparatus 1400 are a custom circuit, an application-specific integrated circuit (ASIC), or the like, such as, for example, one or more circuits (such as a communications circuit 1414) for use in wireless devices like mobile telephones, tablet computers, laptop computers, two-way radios, and similar electronic systems. The IC can perform any other type of function.

The electronic apparatus 1400 may also include an external memory 1420, which in turn may include one or more memory elements suitable to the particular application, such as a main memory 1422 in the form of random access memory (RAM), one or more hard drives 1424, and/or one or more drives that handle removable media 1426 such as compact disks (CD), flash memory cards, digital video disk (DVD), and the like.

The electronic apparatus 1400 may also include a display device 1416, one or more speakers 1418, and a keyboard and/or controller 1430, which can include a mouse, trackball, touch pad, voice-recognition device, or any other device that permits a system user to input information into and receive information from the electronic apparatus 1400.

To better illustrate the methods and/or stretchable computing devices disclosed herein, a non-limiting list of examples is provided herein:

Example 1 includes a stretchable computing device that includes a stretchable body; a first electronic component embedded within the stretchable body; a second electronic component embedded within the stretchable body; and wherein the first electronic component and the second electronic component are connected by stretchable electrical connectors that include vias.

Example 2 includes the stretchable computing device of example 1, wherein the stretchable electrical connectors are non-planar.

Example 3 includes the stretchable computing device of any one of examples 1-2, wherein the stretchable electrical connectors have a partial zig-zag shape and a partial coil shape.

Example 4 includes the stretchable computing device of any one of examples 1-3, and further including a textile attached to the stretchable body.

Example 5 includes the stretchable computing device of any of examples 1-4, wherein the first electronic component is partially embedded within the stretchable body.

Example 6 includes the stretchable computing device of any one of examples 1-5, wherein the second electronic component is partially embedded within the stretchable body.

Example 7 includes method of fabricating a stretchable computing device. The method includes covering an upper surface of a stretchable electronic system with an elastomer, wherein the stretchable electronic system includes a first electronic component and a second electronic component that are connected by stretchable electrical connectors; removing a portion of the stretchable electronic system to expose the stretchable electrical connectors; and covering a lower surface of the stretchable electronic system with an additional elastomer.

Example 8 includes the method of example 7, and further including attaching a patterned resist to the lower surface of the stretchable electronic system before removing a portion of the stretchable electronic system, wherein the patterned resist does not cover the stretchable electrical connectors.

Example 9 includes the method of any one of examples 7-8, and further including the patterned resist from the lower surface of the stretchable electronic system before covering the lower surface of the stretchable electronic system with the additional elastomer.

Example 10 includes the method of any one of examples 7-9, wherein the first electronic component is a first electronic package and the second electronic component is a second electronic package.

Example 11 includes the method of any one of examples 7-10, wherein covering the upper side of the stretchable electronic system with an elastomer includes covering the upper side of the stretchable electronic system with silicone, and wherein removing a portion of the stretchable electronic system that is under the stretchable electrical connectors includes etching the stretchable electronic system to expose the stretchable electrical connectors.

Example 12 includes method of fabricating a stretchable computing device. The method includes covering an upper surface of a stretchable electronic system with an elastomer, wherein the stretchable electronic package includes a first electronic component and a second electronic component that are connected by stretchable electrical connectors that include via sections; removing a portion of the stretchable electronic system to expose the stretchable electrical connectors; and covering a lower surface of the stretchable electronic system with an additional elastomer.

Example 13 includes the method of example 12, and further including attaching a patterned resist to the lower surface of the stretchable electronic system before removing a portion of the stretchable electronic system, wherein the patterned resist does not cover the stretchable electrical connectors that include via sections.

Example 14 includes the method of any of examples 12-13, and further including removing the patterned resist from the lower surface of the stretchable electronic system before covering the lower surface of the stretchable electronic system with the additional elastomer.

Example 15 includes the method of any of examples 12-14, wherein the stretchable electrical connectors are non-planar.

Example 16 includes the method of any one of examples 12-15, wherein the stretchable electrical connectors have a zig-zag shape.

Example 17 includes the method of any one of examples 12-16, wherein the first electronic component is a first electronic package and the second electronic component is a second electronic package.

Example 18 includes the method of any one of examples 12-17, wherein covering the upper surface of the stretchable electronic system with an elastomer includes covering the upper surface of the stretchable electronic system with silicone.

Example 19 includes the method of any one of examples 12-18, wherein removing a portion of the stretchable electronic system that is under the stretchable electrical connectors that include via sections includes etching the stretchable electronic system to expose the stretchable electrical connectors.

Example 20 includes the method of any of examples 12-19, and further including adding conductive sections to the stretchable electrical connectors that include via sections after removing the portion of the stretchable electronic system to expose the stretchable electrical connectors.

The above detailed description includes references to the accompanying drawings, which form a part of the detailed description. The drawings show, by way of illustration, specific embodiments in which the invention can be practiced. These embodiments are also referred to herein as "examples." Such examples can include elements in addition to those shown or described. However, the present inventors also contemplate examples in which only those elements shown or described are provided. Moreover, the present inventors also contemplate examples using any combination or permutation of those elements shown or described (or one or more aspects thereof), either with respect to a particular example (or one or more aspects thereof), or with respect to other examples (or one or more aspects thereof) shown or described herein.

In this document, the terms "a" or "an" are used, as is common in patent documents, to include one or more than one, independent of any other instances or usages of "at least one" or "one or more." In this document, the term "or" is used to refer to a nonexclusive or, such that "A or B" includes "A but not B," "B but not A," and "A and B," unless otherwise indicated. In this document, the terms "including" and "in which" are used as the plain-English equivalents of the respective terms "comprising" and "wherein." Also, in the following claims, the terms "including" and "comprising" are open-ended, that is, a system, device, article, composition, formulation, or process that includes elements in addition to those listed after such a term in a claim are still deemed to fall within the scope of that claim. Moreover, in the following claims, the terms "first," "second," and "third," etc. are used merely as labels, and are not intended to impose numerical requirements on their objects.

The above description is intended to be illustrative, and not restrictive. For example, the above-described examples (or one or more aspects thereof) may be used in combination with each other. Other embodiments can be used, such as by one of ordinary skill in the art upon reviewing the above description.

The Abstract is provided to comply with 37 C.F.R. §1.72(b), to allow the reader to quickly ascertain the nature of the technical disclosure. It is submitted with the understanding that it will not be used to interpret or limit the scope or meaning of the claims.

Also, in the above Detailed Description, various features may be grouped together to streamline the disclosure. This should not be interpreted as intending that an unclaimed disclosed feature is essential to any claim. Rather, inventive subject matter may lie in less than all features of a particular disclosed embodiment. Thus, the following claims are hereby incorporated into the Detailed Description, with each claim standing on its own as a separate embodiment, and it is contemplated that such embodiments can be combined with each other in various combinations or permutations. The scope of the invention should be determined with reference to the appended claims, along with the full scope of equivalents to which such claims are entitled.

The invention claimed is:

1. A stretchable computing device, comprising:
a stretchable body oriented in a first horizontal plane;
a first electronic component embedded within the stretchable body;
a second electronic component embedded within the stretchable body; and
wherein the first electronic component and the second electronic component are connected by stretchable electrical connectors within the stretchable body, wherein the electrical connectors include upper horizontal sections and lower horizontal sections that are connected by vertical vias, wherein the upper horizontal sections, the lower horizontal sections and the vertical vias are within a vertical plane that is orthogonal to the first horizontal plane.

2. The stretchable computing device of claim 1, further comprising a textile attached to the stretchable body.

3. The stretchable computing device of claim 1, wherein the horizontal sections are the same length.

4. A stretchable computing device, comprising:
a stretchable body oriented in a first plane;
a first electronic component embedded within the stretchable body;
a second electronic component embedded within the stretchable body; and
wherein the first electronic component and the second electronic component are connected by stretchable electrical connectors within the stretchable body, wherein the stretchable electrical connectors include linear sections that extend from an end of one via to an end of another via, wherein the vias are orthogonal to the first plane, wherein the linear sections include a first group of parallel horizontal conductors and a second group of parallel horizontal conductors that are at angle relative to first group of parallel horizontal conductors, wherein the stretchable body, the first group of parallel horizontal conductors and the second group of parallel horizontal conductors are in parallel horizontal planes.

5. The stretchable computing device of claim 4, further comprising a textile attached to the stretchable body.

6. The stretchable computing device of claim 4, wherein the first group of parallel horizontal conductors and the second group of parallel horizontal conductors are the same length.

* * * * *